United States Patent [19]
Yoder

[11] 4,380,022
[45] Apr. 12, 1983

[54] MONOLITHIC FULLY INTEGRATED CLASS B PUSH-PULL MICROWAVE GaAs MESFET WITH DIFFERENTIAL INPUTS AND OUTPUTS WITH REDUCED MILLER EFFECT

[75] Inventor: Max N. Yoder, Falls Church, Va.

[73] Assignee: The United States of America as represented by the Secretary of the Navy, Washington, D.C.

[21] Appl. No.: 214,601

[22] Filed: Dec. 9, 1980

[51] Int. Cl.³ .......................................... H01L 29/80
[52] U.S. Cl. ..................................... 357/22; 357/15; 357/51; 330/264
[58] Field of Search ...................... 357/15, 22, 51, 23, 357/36, 68

[56] References Cited
U.S. PATENT DOCUMENTS

| | | | |
|---|---|---|---|
| 3,986,196 | 12/1976 | Decker et al. | 357/22 |
| 4,038,563 | 7/1977 | Zuleeg et al. | 357/22 |
| 4,104,672 | 8/1978 | Di Lorenzo et al. | 357/22 |
| 4,254,430 | 3/1981 | Beneking | 357/22 |
| 4,313,126 | 1/1982 | Krumm et al. | 357/22 |
| 4,315,272 | 2/1982 | Vorhaus | 357/22 |

FOREIGN PATENT DOCUMENTS 55-21184  2/1980  Japan .................................. 357/22

OTHER PUBLICATIONS

L. Napoli et al., "GaAs FET for H.P. AMPs at Microwave Freq.," 1973 NTL Tele. Conf., vol. II, Atlanta, GA, pp. 23B-1-23B-3.
M. Fukuta et al., "GaAs Microwave Power FET," IEEE Trans. on Elec. Dev., vol. ED-23, #4, Apr. 1976, pp. 388-394.
C. Liechti, "Perf. of Dual Gate GaAs MESFET's . . . Modulators," IEEE Trans. on Micro. Th. & Tech., vol. MTT-23, #6, Jun. 1975, pp. 461-469.
C. Liechti, "Microwave Field-Effect Transistors, 1976", IEEE Trans. on Micro. Th. & Tech., vol. MTT-24, #6, Jun. 1976, pp. 279-300.
V. Sokolov et al., "X-Band Monolithic GaAs Push-Pull Amplifiers," ISSCC 1979, Feb. 15, 1979, pp. 118-119.
A. Higashisaka et al., "A 6 GHz-25W GaAs MESFET With an Exp. Opt. Pattern," IEEE MITT-S Int. Micr. Symp. Dig., May 1980, pp. 9-11.
A. Higashisaka et al., "A High-Power GaAs MESFET With an Exp. Opt. Pattern," IEEE Trans. on Elec. Dev., vol. ED-27, #6, Jun. 1980, pp. 1025-1029.

Primary Examiner—Joseph E. Clawson, Jr.

[57] ABSTRACT

A class B microwave, push-pull, balanced amplifier and an amplifying element for use therein is disclosed. A field-effect transistor having at least two gates, two drains and a common source has, inter alia, a center-tapped output transformer connected across the drains. A branch including a DC voltage source connects the center-tap of the transformer and the common source of the field effect transistor. Parasitic loss mechanisms associated with the source contacts and leads are eliminated because the current in the branch connecting the source to the transformer is not at the signal frequency. The FET can comprise a semiconductor body having alternating drain and source electrodes with gate electrodes therebetween. Source electrodes are connected in common. Alternate drain electrodes are connected to one output terminal; the remaining drain electrodes are connected to the other output terminal. The two gate electrodes lying between any two consecutive drain electrodes are respectively connected to opposite input terminals.

4 Claims, 4 Drawing Figures

MONOLITHIC FULLY INTEGRATED CLASS B PUSH-PULL MICROWAVE GAAS MESFET WITH DIFFERENTIAL INPUTS AND OUTPUTS WITH REDUCED MILLER EFFECT

BACKGROUND OF THE INVENTION

This invention relates generally to balanced amplifiers and more particularly to transistors utilized in such amplifiers.

Gallium arsenide (GaAs) field-effect transistors (hereafter FETs) when used as active elements in power amplifiers exhibit parasitic loss mechanisms which adversely affect the amplifier gain. These loss mechanisms are associated with the source electrode of the FET and include (1) the channel resistance $r_c$ between the gate electrode and the source electrode, (2) the resistance $R_c$ of the source metallization contact, (3) the resistance $R_s$ of the source lead wire, and (4) the inductance $L_s$ of the source lead wire. In a class A power FET amplifier, signal current at the fundamental frequency flows in the lossy components $r_c$, $R_c$, $R_s$ and $L_s$. These parasitic loss mechanisms can account for up to 6 db of loss at microwave frequencies. Since a typical class A power FET amplifier exhibits less than 5 db of net gain at its rated output power, the loss is significant.

A class B push-pull amplifier employing two FETs requiring two input signals 180° out of phase with each other, and a center-tapped output transformer, has been disclosed in the paper "X-Band Monolithic GaAs Push-Pull Amplifiers", V. Sokolov et al, 1979 IEEE International Solid-State Circuits Conference at page 118. Each FET exhibits the loss mechanisms $r_c$, $R_c$, $R_s$ and $L_s$ associated with its source terminal and signal currents at the fundamental frequency flow in the lossy components. However, by placing the two FETs side-by-side on the same GaAs chip and connecting the source lead wires together, the source lead-wire resistance $R_s$ and the source lead-wire inductance $L_s$ are significantly reduced. In the aforementioned class B push-pull amplifier, the improved gain was found to just exceed the initial losses associated with splitting the input signal from an unbalanced to a balanced configuration. Nevertheless, at frequencies above 15 GHz, the lossy components $r_c$, $R_c$, $R_s$ and $L_s$ continue to further degrade amplifier gain and efficiency.

OBJECTS OF THE INVENTION

Accordingly, it is an object of the present invention to improve the performance of a microwave amplifier.

It is another object of the present invention to provide an improved class B microwave push-pull amplifier.

It is a further object of the present invention to provide an improved class B microwave push-pull amplifier exhibiting low losses.

It is yet another object of the present invention to provide a field-effect transistor for such an amplifier having a new physical arrangement of elements to eliminate loss mechanisms.

Yet a further object of the present invention is to provide a means of cancelling the deleterious effects of Miller feedback capacitance between the gate and drains within the field-effect transistor.

SUMMARY OF THE INVENTION

The objects of the present invention are achieved by a class B, microwave balanced amplifier including as amplifying elements a field-effect transistor which has a minimum of two gates, two drains, and a common source. Terminals are provided for supplying one of two balanced input signals to one gate bus and for supplying the other of the two balanced input signals to the other gate bus. A winding is connected across the two drains. The winding has a center-tap connected to one polarity terminal of a DC energizing voltage source; the FET common source is connected to the other terminal of the DC energizing voltage source. The outputs at the two drains are combined at the winding to produce a waveform that is a replica of one of the balanced input signals. Current flow in the resistance of the source metallization contact, and in the resistance and inductance of the source lead wire, is at the second and higher even harmonic frequencies so that these resistances and inductances do not represent parasitic loss feedback mechanisms for the fundamental frequency signal of interest. Consequently, signal gain and amplifier efficiency are significantly improved.

In another aspect, the invention relates to a push-pull field-effect transistor. The transistor includes a body of semiconductive material. A plurality of drain, gate and source electrodes are positioned in serial order on the upper surface of the semiconductor body. The plurality of electrodes include at least two drain electrodes, two gate electrodes and one source electrode. The drain and source electrodes alternate with each other, and a gate electrode is positioned between each drain and source electrode. The source electrodes are connected in common. The two gate electrodes lying between any two consecutive drain electrodes are respectively connected to opposite input terminals. Alternate drain electrodes are connected to one output terminal and the remaining drain electrodes are connected to the other output terminal.

BRIEF DESCRIPTION OF THE DRAWINGS

A more complete appreciation of the invention and many of the attendant advantages thereof will be readily attained as the same becomes better understood when considered in connection with the accompanying drawings, wherein.

DETAILED DESCRIPTION OF THE PREFERRED EMBODIMENT

Figure 1:
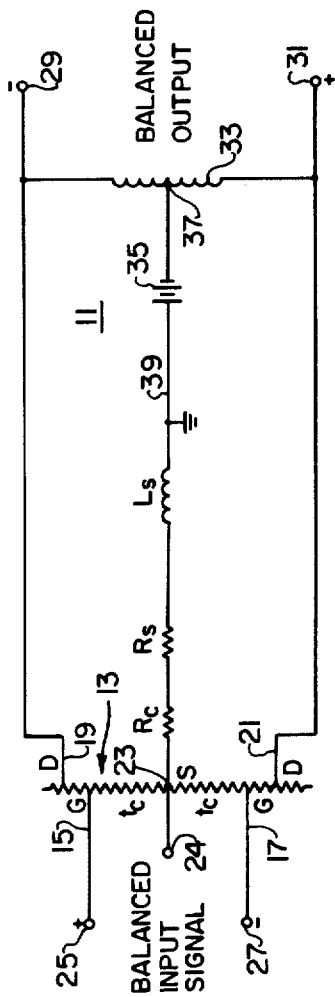
FIG. 1 is a schematic circuit diagram of a class B push-pull microwave amplifier according to this invention.

Referring now to the drawings, wherein like reference numerals designate identical or corresponding parts throughout the several views, and more particularly to FIG. 1 thereof, there is illustrated a schematic circuit diagram of the monolithic class B microwave, push-pull, balanced amplifier of the present invention. The push-pull amplifier, generally indicated at 11, is formed of a single FET 13 having two gates 15 and 17, two drains 19 and 21, and a common source 23. As illustrated, the amplifier can be regarded as a four-terminal circuit. Balanced input signals are applied to two of the terminals 25 and 27 respectively, hereinafter referred to as the phase 1 and phase 2 input terminals, and the output is taken from the other two terminals 29 and 31 respectively, hereinafter referred to as the phase 1 and phase 2 output (drain) terminals. The phase 1 input terminal 25 is connected to one gate 15 of the FET 13 and the phase 2 input terminal 27 is connected to the other gate 17 of the FET. The phase 1 output terminal 29 is connected to the drain 19 adjacent to gate 15 and the phase 2 output terminal 31 is connected to the drain 21 adjacent to gate 17. A center-tapped winding 33 is connected across the output terminals 29 and 31, and a source of DC energizing voltage 35 is connected between a common source 23 of the FET 13 and the center-tap 37 of the center-tapped winding 33.

In operation, when balanced input signals (sine waves) are applied to the gates 15 and 17, each drain 19 and 21 delivers one-half of an amplified sine wave signal to the winding 33. The amplified drain currents are out of phase with respect to the center-tap 37 of the center-tapped winding 33 but add to produce a waveform across the output terminals 29 and 31 which is a replica of one of the balanced input signal (see FIG. 2).

Each section of the amplifier inverts the signal. That is, a positive-going signal at input 25 results in a negative-going signal at output 29; a negative-going signal at input 25 results in a positive-going signal at output 29. A similar inverting relationship exists between terminals 27 and 31. The instantaneous relative polarity of output terminal 31 is therefore identical to that of the instantaneous relative polarity at input terminal 25. Similarly, the instantaneous relative polarity at terminal 29 is identical to that of terminal 27.

Figure 2:
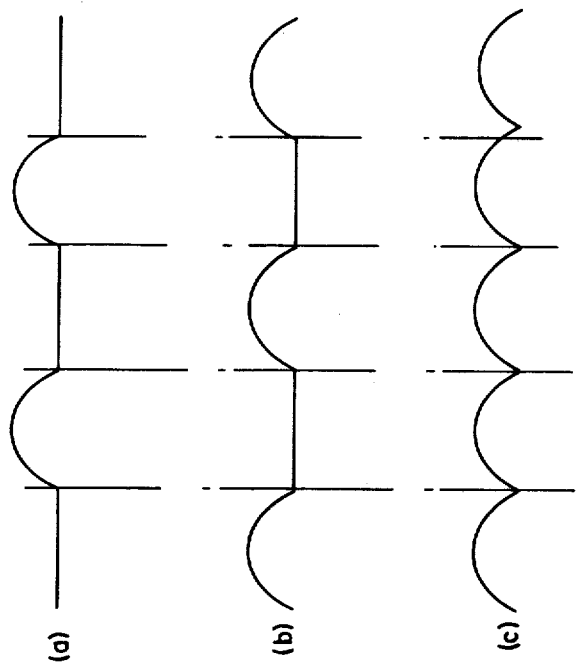
FIG. 2 is a graphic representation of waveforms useful in explaining the operation of the amplifier of FIG. 1.

The loss mechanisms associated with the common source 23 of the FET 13 are shown schematically in FIG. 1 and include the channel resistance $r_c$ between each gate terminal and the source terminal. In addition, the source metallization contact resistance $R_c$, the source lead-wire resistance $R_s$ and the source lead-wire inductance $L_s$ can be regarded as connected in series between the source terminal of the FET and the source of DC energizing voltage 35. The push-pull amplifier illustrated in FIG. 1 totally eliminates fundamental-frequency signal losses due to $R_c$, $R_s$, and $L_s$. This can be seen by referring to FIG. 2 which illustrates waveforms useful in explaining the operation of the amplifier of the present invention. FIGS. 2(a) and 2(b) illustrate the respective output current waveforms at the phase 1 and phase 2 output terminals 29 and 31. FIG. 2(c) illustrates the current waveform in the branch 39 containing the lossy components $R_c$, $R_s$ and $L_s$. Whereas in prior-art class A and class B amplifier circuits, the current in the lossy components $R_c$, $R_s$, and $L_s$ is at the fundamental frequency, the current waveform of FIG. 2(c) is at the second harmonic frequency because the current waveforms of FIGS. 2(a) and 2(b) combine algebraically in the branch 39 containing $R_c$, $R_s$ and $L_s$. In the amplifier of FIG. 1, the fundamental output signal frequency does not pass through $R_c$, $R_s$, and $L_s$; hence they no longer represent an effective loss feedback mechanism in common with the input circuit for the signal of interest. This is particularly relevant for signal frequencies above 12 GHz.

Figure 3:
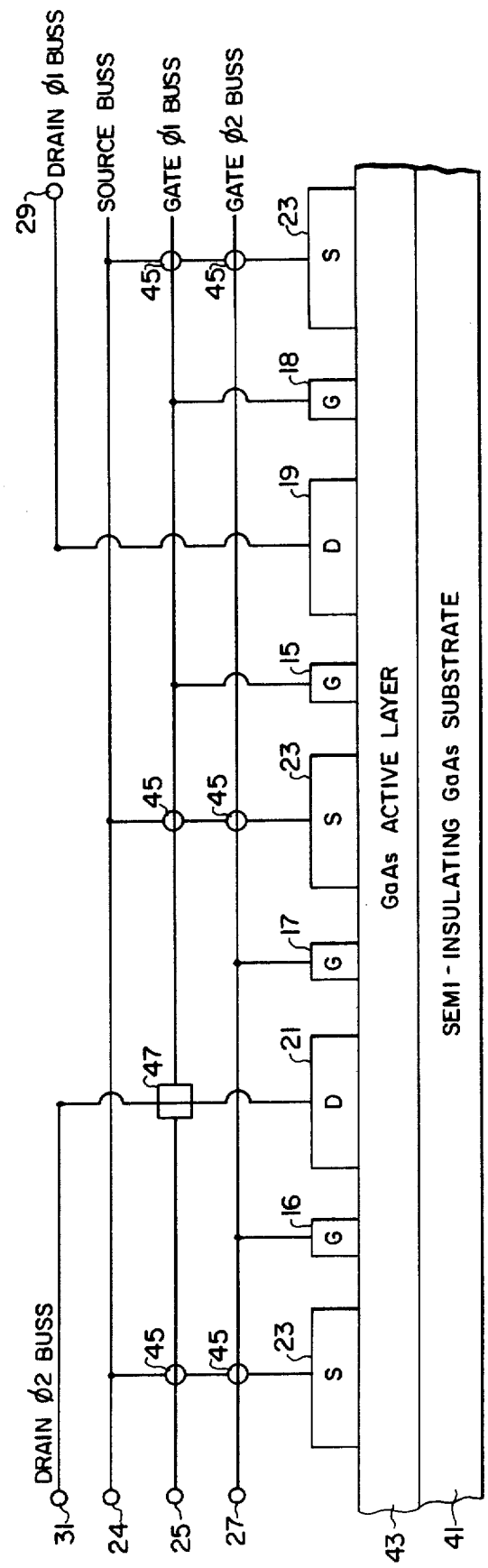
FIG. 3 is a partially cut-away sectional view of a practical embodiment of an FET which can be incorporated in the amplifier in FIG. 1, and whose metallic interconnecting leads are shown schematically.
Figure 4:
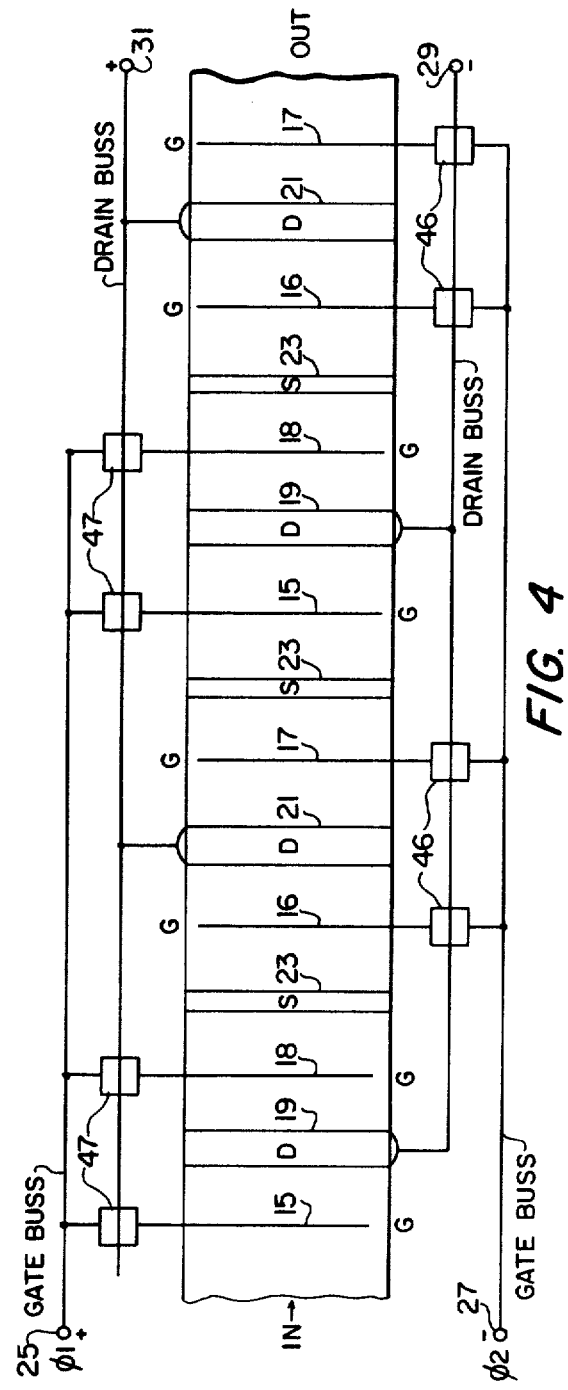
FIG. 4 is a partial plan view of the FET illustrated in FIG. 3.

FIG. 3 shows a partially cut-away sectional view and FIG. 4 shows a partial plan view of a practical embodiment of a FET which can be incorporated in the amplifier of FIG. 1. By way of example, but not as a limitation, the invention will be described as it applies to a gallium arsenide FET.

The FET can be constructed using well-known planar fabrication techniques. A starting substrate 41 of semi-insulating GaAs is provided. Over substrate 41 is grown an active layer 43 of GaAs. Source (S), gate (G) and drain (D) electrodes 23, 15-18, and 19 and 21, respectively, are formed of appropriate metals on the upper surface of the active layer 43 to complete the FET 13. As discussed above, the losses associated with the source metallization contact resistance $R_c$ are effectively eliminated in the amplifier of FIG. 3. Accordingly, a heavily doped N+ contact layer of GaAs between the active layer and the actual metal contacts to minimize those losses is not required. However, the use of an N+ contact layer or of selective N+ regions for the source and drain metallizations is not precluded, and the use of conventional selective ion-implanted or alloyed N+ ohmic contacts may actually improve reliability. The gates can be either of the Schottky barrier or of the insulator type. As shown, the drain, gate and source electrodes are positioned in serial order on the upper surface of the semiconductive body, the drain electrodes 19, 21 and source electrodes 23 alternating with each other, a gate electrode 15-18 lying between each drain and source electrode. The actual FET can have many additional gates, drains and sources, so long as they are in even quantities and in the sequence shown. The source leads are connected in common to terminal 24. The common source interconnecting ribbon has been omitted from the partial plan view of FIG. 4 for clarity. Alternate drain electrodes 19 are connected to the phase 1 output terminal 29; the remaining drain electrodes 21 are connected to the phase 2 output terminal 31. The two gate electrodes 17, 15 lying between consecutive drain electrodes 21, 19 are connected to opposite input terminals. The gate electrodes 15 immediately preceding the gate electrodes 18 immediately following drain electrodes 19 are connected to the phase 1 input terminal 25. The gate electrodes 16 immediately preceding the gate electrodes 17 immediately following electrodes 21 are connected to the phase 2 input terminal 27. Similarly, phase 1 gates 15 and 18 are placed adjacent to and on opposite sides of phase 1 drain 19 whereas phase 2 gates 16 and 17 are placed on opposite sides of and adjacent to phase 2 drain 21. Any additional gates added to the FET are similarly located on opposite sides of and adjacent to their respective drain. The various source, drain and gate leads are separated by means of crossover capacitors 45, 46, 47 which can be formed of dielectric materials such as $SiO_2$, $Si_4N_3$, or of an air gap. Source bus cross-over capacitors 45 should preferably be of the low capacitance airbridge type.

Extremely important to the operating efficiency of multiple gate FETs is the effect of the well-known Miller capacitance between the gate and drain contacts within the FET itself. Since the instantaneous relative polarities of any given drain and its adjacent gate are opposite (i.e., 180° out of phase) at any given time, the effect of the Miller capacitance is to cause unwanted negative feedback. Since the instantaneous relative polarity of drain bus 31 is identical to that of the instantaneous relative polarity of gate bus 25, the signals at the plates of crossover capacitors 47 are of the same polarity (but differing magnitude). Similarly, the signals at the plates of crossover capacitors 46 are of the same polarity, but of different magnitude, as the signals of drain bus 29 and gate bus 27. By properly choosing the dielectric constant, area, and dielectric thickness of crossover capacitors 46 and 47, the Miller capacitance within the device may be cancelled by positive feedback. In multiple-gate (e.g., >6 gates) devices, the presence of crossover capacitors 46 and 47 prevents the build-up of Miller-capacitance—generated backward-traveling waves along gate busses 25 and 27. This Miller cancellation is particularly important in larger devices wherein the lengths of the gate busses exceed 0.1 wavelength.

In the embodiment of FIGS. 3 and 4, gates 15 and 18 connected to the phase 1 input terminal 25 and drains 21 connected to the phase 2 output terminal 31 are taken off on one side; gates 16 and 17 connected to the phase 2 input terminal 27 and drains 19 connected to the phase 1 output terminal 29 are taken off from the other side.

Parasitic interconnect lead capacitance, however, may adversely affect device stability, and in that case optional layouts of interconnect leads may be necessary. Two obvious choices (not shown) are: (1) gates and drains connected to phase 1 terminals on a common side with gates and drains connected to phase 2 terminals on the opposite side, or (2) all drains on one side and all gates on the opposite side. If all sources are to be plated through to a common ground plane, this plating should not be in the central active channel region; plating through in the active channel region would introduce metallization contact resistance problems. Such plating, if required for thermal or other purposes, should be in regions immediately adjacent to the source fingers for each cell of the FET.

In operation, fundamental-frequency signal current remains in the GaAs active layer channel in the vicinity of the source contacts. The only fundamental-frequency signal in the source metallization contact or lead is that resulting from an unequal transconductance among adjacent cells of the FET. This is usually virtually nonexistent in FETs made from homogeneous material.

Therefore, there has been provided an improved FET microwave amplifier wherein (1) the current flowing in the resistance of the source metallization contact and in the resistance and inductance of the source lead wire is at the second harmonic (or above) frequency so that these resistances and inductances do not represent parasitic loss feedback mechanisms for the fundamental signal of interest and (2) the deleterious Miller capacitance and the resulting backward-traveling wave are cancelled. Consequently, signal gain and amplifier efficiency are significantly improved.

Obviously, many modifications and variations of the present invention are possible in light of the above teachings. Thus, for example, the techniques herein described are applicable to FETs of any semiconductor material. The amplifier of FIG. 1 can also incorporate vertical channel FETs wherein the morphology is such that the common sources are on the bottom and the separate drains are on the top. Likewise, the teachings of the invention might also be applied to bipolar transistors in the unconventional inverted form wherein the lower morphological regions constitute the common emitters, the middle region the base, and the upper region the separate collectors. It is therefore to be understood that within the scope of the appended claims, the invention may be practiced otherwise than as described.

What is claimed is:

1. An improved field effect transistor device of the type having a body of semiconductor material, and a plurality of drains, gates and sources operatively disposed on the body of semiconductor material, said field effect transistor device being connected in a differential input and output configuration including a positive gate bus, a negative gate bus, a positive drain bus, a negative drain bus, and a common source bus, wherein the improvement for a single one of a plurality of alternate parallel connected operating units of said field effect transistor device comprises:

a common source operatively connected to the common source bus;

first and second drains juxtaposed on opposite sides of said common source, said first drain being operatively connected to the negative drain bus, and said second drain being operatively connected to the positive drain bus;

first and second gates juxtaposed on opposite sides of said first drain, said first and second gates being operatively connected to the positive gate bus;

third and fourth gates juxtaposed on opposite sides of said second drain, said third and fourth gates being operatively connected to the negative gate bus; and positive feedback means including first, second, third and fourth crossover capacitors, said first and second crossover capacitors being operatively connected between the positive gate bus and the positive drain bus at said first gate and said second gate, respectively, and said third and fourth crossover capacitors being operatively connected between the negative gate bus and the negative drain bus at said third gate and said fourth gate, respectively, for minimizing the negative feedback effect of the Miller capacitance beween the positive gate bus and the positive drain bus and said first and second gates and said first drain, and for minimizing the negative feedback effect of the Miller capacitance between the positive gate bus and the positive drain bus and said first and second gates and said second drain.

2. The improved field effect transistor device of claim 1 further including fifth and sixth crossover capacitors, said fifth crossover capacitor being operatively connected between the common source bus and the positive gate bus for separating said common source from said first and second gates, and said sixth crossover capacitor being operatively connected between the common source bus and the negative gate bus for separating said common source from said third and fourth gates.

3. The improved field effect transistor device of claim 2 wherein said first and second crossover capacitors operate to separate said first and second gates, respectively, from said second drain, and wherein said third and fourth crossover capacitors operate to separate said third and fourth gates, respectively, from said first drain.

4. The improved field effect transistor device of claim 3 wherein the body of semiconductor material comprises gallium arsenide.

* * * * *